United States Patent

Carbrey

[15] 3,651,515

[45] Mar. 21, 1972

[54] CAPACITIVE SWITCHED GAIN RATIO OPERATIONAL AMPLIFIER PCM DECODER

[72] Inventor: Robert L. Carbrey, Boulder, Colo.

[73] Assignee: Bell Telephone Laboratories, Incorporated, Murray Hill, N.J.

[22] Filed: Nov. 25, 1969

[21] Appl. No.: 879,783

[52] U.S. Cl. ........................340/347 DA, 179/15 AE, 325/38

[51] Int. Cl. ........................H03k 13/02

[58] Field of Search ..................340/347; 179/15 AE; 325/38

[56] References Cited

UNITED STATES PATENTS

| | | | |
|---|---|---|---|
| 3,505,668 | 4/1970 | Ottesen | 340/347 |
| 3,441,913 | 4/1969 | Pastoriza | 340/347 |
| 3,419,819 | 12/1968 | Murakami | 340/347 |
| 3,377,586 | 4/1968 | Kaneko | 179/15 AE |
| 3,180,939 | 4/1965 | Hall | 179/15 AE |
| 3,072,332 | 1/1963 | Margopoulos | 340/347 |

*Primary Examiner*—Maynard R. Wilbur
*Assistant Examiner*—Jeremiah Glassman
*Attorney*—R. J. Guenther and E. W. Adams, Jr.

[57] ABSTRACT

A self-companding pulse code modulation converter employs switched gain ratio of an operational amplifier. Capacitors, weighted to correspond to the quantizing characteristic, are switched between the input and feedback circuits of an operational amplifier to change the gain ratio.

7 Claims, 9 Drawing Figures

INVENTOR
R. L. CARBREY
BY David P. Kelley
ATTORNEY

CAPACITIVE SWITCHED GAIN RATIO OPERATIONAL AMPLIFIER PCM DECODER

BACKGROUND OF THE INVENTION

This invention relates to the nonlinear conversion of analog signals and quantized pulse code modulation (PCM) signals, one to the other. In particular, the invention relates to signal conversion with volume compression and expansion, i.e., companding.

In PCM, analog signal samples are converted by quantizing and encoding. That is, a series of discrete levels called quantum levels is assigned to each analog sample. The encoded analog sample consists of a number of digits or pulses indicative of the particular quantum levels which, when added together, produce an approximation of the analog signal. In general, a certain amount of error is inherent in the quantizing process. Only in the very rare instance when the designated quanta add up to be exactly equal to the analog sample will the coding be error free. This inherent error is known as quantizing noise. Obviously, any scheme which minimizes the effect of quantizing noise will enhance the fidelity of the coding process. This minimization may be accomplished by keeping the signal to quantizing noise ratio at a relative maximum over the analog signal amplitude range.

Usually, the distribution of signal to quantizing noise ratio is not uniform over all quantizing levels. Larger signals maintain an acceptable signal to quantizing noise ratio for errors which are relatively large, while the smaller signals require a proportionally smaller error to maintain a comparable signal to quantizing noise ratio. It is for this reason that volume range compression and expansion, known as companding, is used for maximizing the average signal to quantizing noise ratio. With companding, more quantum levels are assigned to lower level signals than to the higher level signals. In this way, smaller signals are encoded with an accuracy comparable to that of the larger signals, thereby causing the signal to quantizing noise ratio to be relatively uniform over all quantum levels and maximizing the average signal to quantizing noise ratio. Effectively, this encoding procedure results in a volume compression of the signal which must be accompanied by an appropriate volume expansion in the decoding process. It is appropriate to note that companding is a fundamentally nonlinear process. The precise character of the nonlinearity, however, is one of the variables available to the choice of the designer. Two of the more popular nonlinear coding characteristics are the logarithmic and hyperbolic types.

Traditionally, companded PCM systems have been implemented with a compressor and a coder at the transmitting end and a decoder and expandor at the receiving end. Normally, these units have been discrete; for example, separate compression and encoding units within the transmitter. Recently, however, a class of PCM encoders has been developed in which these units are combined and the encoding unit is self companding. One particular example of such an arrangement is shown in U.S. Pat. No. 2,889,409 of R. L. Carbrey in which there is disclosed a self-companding hyperbolic coder using a feedback amplifier. Moreover, such feedback arrangements are representative of one class of compandor of which the present invention is an example.

SUMMARY OF THE INVENTION

In the copending U.S. Pat. application, Ser. No. 879,661, of R. L. Carbrey, PCM analog to digital and digital to analog converters are realized by changing the gain ratio of an operational amplifier by operating a switched impedance divider. A particular embodiment is illustrated with a switched resistance divider.

In an illustrative embodiment of the present invention, a voltage divider using a plurality of capacitors, weighted according to the desired coding scheme, is switched between the input and feedback circuits of an operational amplifier. As the configuration of these circuits is changed, the gain ratio of the amplifier is changed accordingly. Thus, each coded sample may be represented by a particular gain ratio, each value of gain corresponding to a configuration of these circuits. The gain ratio of such an operational amplifier varies from zero, when all of the capacitors are in the feedback circuit, to some maximum gain, when all capacitors are in the input circuit.

It is a feature of the present invention that the gain ratio of an operational amplifier is changed by switching the capacitance of its associated circuitry in accordance with a binary code to generate a hyperbolic compression characteristic. In addition, automatic scaling provides an optimum match to the signal level in a composite instantaneous and syllabic compandor.

These and other features of the present invention will be more readily apparent from the following detailed description taken in conjunction with the accompanying drawings.

DETAILED DESCRIPTION

Figure 1A:
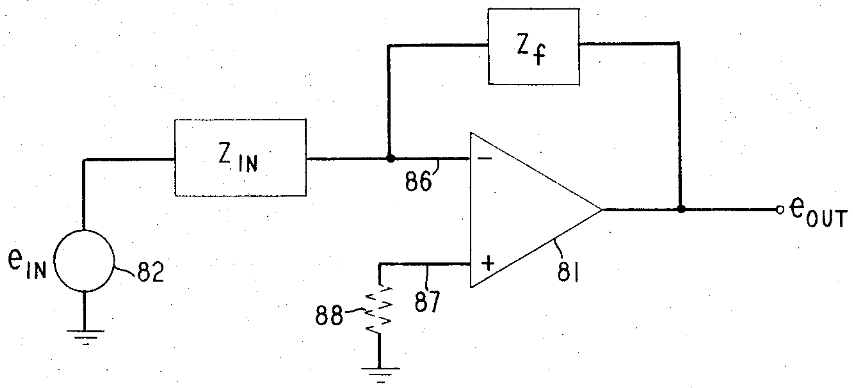
FIG. 1A PRIOR ART
FIGS. 1A and 1B are two well known operational amplifier arrangements.
Figure 1B:
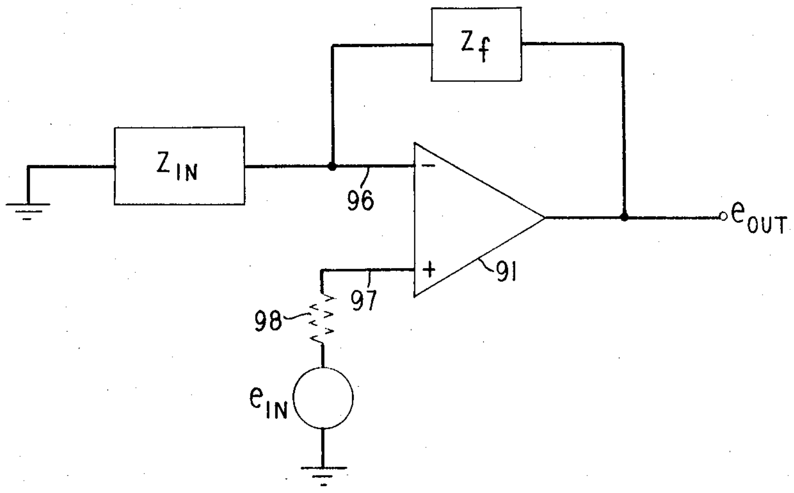
FIG. 1B PRIOR ART

For a better understanding of the principles of the invention, it may be instructive to review briefly the normal operation of an operational amplifier. FIGS. 1A and 1B show two standard configurations; FIG. 1A designates an operational amplifier connected in an inverting configuration, while FIG. 1B designates an operational amplifier connected in a noninverting configuration. In both figures, $Z_f$ represents the total impedance of the feedback circuit and $Z_{in}$ represents the total impedance of the input circuit.

In FIG. 1A, input voltage source 82 is connected to inverting input terminal 86 of amplifier 81 through $Z_{in}$. $Z_f$ connects input terminal 86 to the output bus, and noninverting input 87 is grounded either directly or through a resistor 88. It is commonly known that the gain for this configuration may be expressed as $$\text{Gain} = \frac{e_{out}}{e_{in}} = -\frac{Z_f}{Z_{in}} \quad (1)$$

If the input and feedback circuits are entirely capacitive, $$\text{Gain} = -\frac{Z_f}{Z_{in}} = -\frac{1/j\omega C_f}{1/j\omega C_{in}} = -\frac{C_{in}}{C_f} \quad (2)$$

where $\omega$ is the radian frequency and $C_{in}$ and $C_f$ are the total impedance of the input and feedback circuits, respectively. The negative sign represents an inversion of polarity.

In FIG. 1B, amplifier 91 with terminals 96 and 97, impedances $Z_f$ and $Z_{in}$, resistor 98, and voltage source 92 all perform the same functions as their analogs perform in FIG. 1A. The basic difference in FIG. 1B, however, is that $e_{in}$ is placed onto terminal 96, while $Z_{in}$ is grounded. The result, as is commonly known, is a gain expression of $$\text{Gain} = \frac{e_{out}}{e_{in}} = 1 + \frac{Z_f}{Z_{in}} \quad (3)$$

Figure 2:
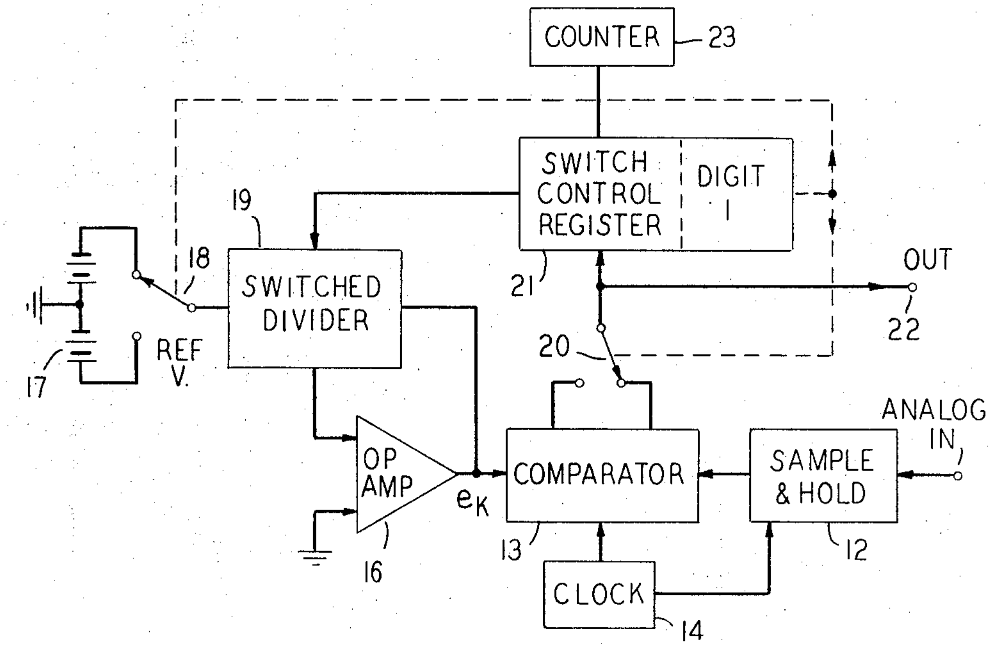
FIG. 2 is a block diagram of a first illustrative embodiment of the invention.

FIG. 2 is a block diagram of an analog to digital converter which illustrates the principles of the present invention. The analog signal to be encoded is brought into a sample and hold circuit 12, which, under the control of appropriate clock timing pulses from a clock 14, delivers analog samples to a comparator network 13. The comparator network 13 compares the sampled analog voltage from the sample and hold circuit 12 with a voltage $e_K$ which is the output voltage of an operational amplifier 16. A switched divider network 19 is connected in the feedback path of operational amplifier 16 and also to a dual polarity reference voltage 17 through a single pole double throw switch 18. In this manner, the input and feedback circuits of the operational amplifier 16 may be changed by operating the switched divider 19, thus varying the gain of the amplifier 16 and, amplifier output voltage $e_K$.

The comparator 13, on the basis of the aforementioned comparison between $e_K$ and the analog sample, emits pulses through switch 20 to a switch control register 21 and to output terminal 22, thereby resetting one selected stage of the switch control register 21. The routing operations of the switch control register 21 are controlled by a counter 23. The function of the switch control register 21 is twofold, as is designated by the dashed division in the figure. The first of these functions, a polarity control, is performed by its "digit 1" control of the aforementioned switches 18 and 20. The polarity of reference voltage 17 is determined by the position of switch 18, and the adaptation of the operation of comparator 13 to the polarity of the analog sample is determined by the position of switch 20; proper encoding operation is thus assured for samples of both polarities. The second function of the switch control register 21 is the control of the operation of the switched divider 19. It is by means of this control that the feedback and input circuits of operational amplifier 16 are manipulated to effect a change in voltage $e_K$. Each time a different $e_K$ is established, the comparator makes a new comparison and sends an appropriate signal to the switch control register 21, resulting in a different configuration within switched divider 19 and consequent change in $e_K$. This process is continued for each of the $n$ digits. The switch combination thus established encodes the analog sample in question to the desired accuracy, as represented by the operational amplifier output voltage $e_K$.

Figure 3A:
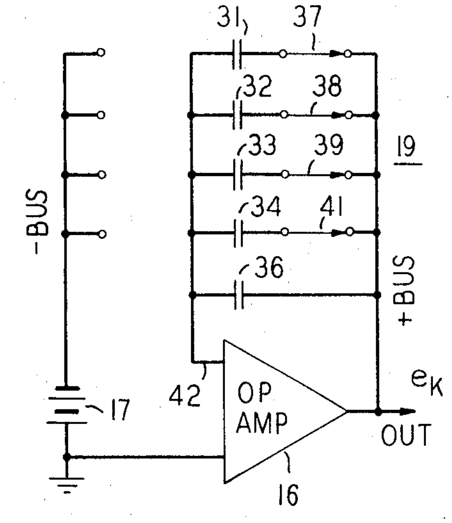
FIGS. 3A and 3B are diagrammatic views of a portion of the circuit of FIG. 2.
Figure 3B:
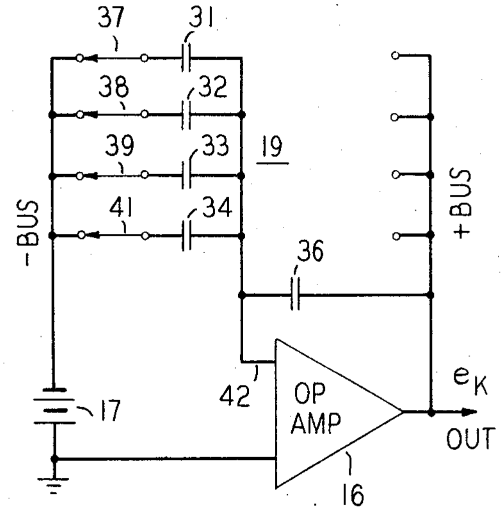

The operation of the switched divider 19 with operational amplifier 16 may be more clearly understood upon consideration of FIGS. 3A and 3B. These figures depict the combination of operational amplifier 16 and switched divider 19 of FIG. 2; FIG. 3A represents the switched divider 19 configuration for minimum gain, or $e_K$=0, and FIG. 3B depicts the configuration of the switched divider 19 for maximum gain. FIGS. 3A and 3B show the arrangement for four digits of code, resulting in $2^4$ or 16 coding levels (15 positive levels and zero). Reversing the polarity of the reference voltage as dictated by an additional polarity digit results in 15 negative levels and zero. It is appropriate to note that if, for the minimum gain situation, some small gain other than zero is desired, a fixed capacitor may be connected into the input circuit between reference source 17 and operational amplifier input 42. As can be seen in FIGS. 3A and 3B, the switched divider 19 comprises a plurality of capacitors 31, 32, 33 34 and 36, each connected on one side to operational amplifier input 42, capacitor 36 being fixed to an output bus and the others being connected by single pole double throw switches 37, 38, 39 and 41 between the input and output busses. If capacitors 31, 32, 33 34 and 36, respectively, are valued 8C, 4C, 2C, C, and C, the desired hyperbolic characteristic will be automatically obtained. It is apparent that the invention is applicable to other types of coding characteristics by suitably weighting the capacitances.

In the configuration of FIG. 3A, the total capacitance of the input circuit is zero and, therefore, the total gain of the configuration is zero, resulting in $e_K$=0. In the configuration of FIG. 3B the total capacitance of the input circuit is equal to 15C and the total capacitance of the output circuit is equal to C, thereby resulting in a gain calculation of −15 from equation 2. If the reference voltage source 17 is equal to v., $e_K$ is equal to −15 v. The various configurations which are obtainable by switching capacitors 31 through 34 between the input and feedback circuits will thus result in gains between zero and 15.

The particular gains which may be computed utilizing equation 2 and the aforementioned assignment of capacitance values are: −1/15, −1/7, −3/13, −1/3, −5/11, −3/5, −7/9, −1, −9/7, −5/3, −11/5, −3, −13/3, −7 and −15. The amplifier gain for the $k^{th}$ code combination is given by $G_K = {}^{-k/}(2^n - k)$ for $k$=0 to $k=2^n-1$ where $n$ is the number of digits in the code which are used to control the switched divider. The integer $K$ thus corresponds to the decimal equivalent of the conventional binary code. For example, the binary code 1,000 has a decimal equivalent of 8.

With this knowledge it is possible to trace a complete coding sequence utilizing the circuit of FIG. 2. Initially, switches 37, 38, 39 and 41 in switched divider 19 are connected to the output bus; that is, they are connected into the feedback circuitry of the operational amplifier. This condition is established initially by setting the switch control register 21 to the binary code 0000 corresponding to $k$=0. The sampled analog voltage from the sample and hold circuit 12 is compared with voltage $e_K$, which is zero, and a digital signal is emitted from the comparator 13 to enable a "digit 1" polarity determination. Switches 18 and 20 are then properly adjusted to account for the polarity of the analog signal to be coded. If the signal sample input to comparator 13 is positive, the comparator 13 under the control of the clock 14 produces a first digit output of "0"; otherwise it is a "1." The switch control register 21 then begins the synthesis of the code word by causing the code 1,000 ( $k$=p) to be registered. This switches capacitor 31 to the negative bus (into the input circuit) by means of switch 37. In the illustrative example coder with four switched digit capacitors, capacitor 31 has a value 8C and the parallel value of the remaining capacitors 32, 33, 34 and 36 is also 8C. The resulting gain $$G_k = \frac{-k}{2^n - k} = \frac{-8}{16-8} = -1 \text{ and } e_K = G_k(-V) = -1(-V) = V.$$

$e_K$ is then compared in comparator 13 with the sampled analog voltage. If the sampled voltage is still greater than $e_K$ a "0" pulse is emitted, capacitor 31 remains in the input circuit, and synthesis of the next digit of the code word begins. On the other hand, if $e_K$ is larger than the sampled analog voltage, a "1" pulse is emitted which resets the register to the code 0000. This resets switch 37 to switch capacitor 31 back to the feedback circuit. The switch control register then begins synthesis of the third digit by switching capacitor 32 into the input circuit. The input circuit now contains either capacitor 32 alone (corresponding to $k$=4 for the registered code 0100) or the parallel combination of capacitors 31 and 32 for the registered code 1,100 ($k$=12) depending upon the previous comparison of $e_K$ with the sampled analog voltage. The respective values of $$e_K \text{ are } e_K = \frac{4}{16-4} V = V/3 \text{ and } e_K = \frac{12V}{16-12} = 3V.$$

The new value of $e_K$ is once more compared to the sampled analog voltage and a "1" or a "0" is transmitted to the output depending upon whether the analog voltage is smaller or larger than voltage $e_K$. If the analog voltage is the larger, a "0" is emitted, and capacitor 32 is switched back into the feedback circuit. Otherwise, it remains in the input circuit. The same procedure is repeated in sequence for capacitor 33 and then for capacitor 34. At this point the coding of the particular analog sample is completed and counter 23 resets all switches on the switched divider 19 and the coding of the next analog sample begins.

Figure 4:
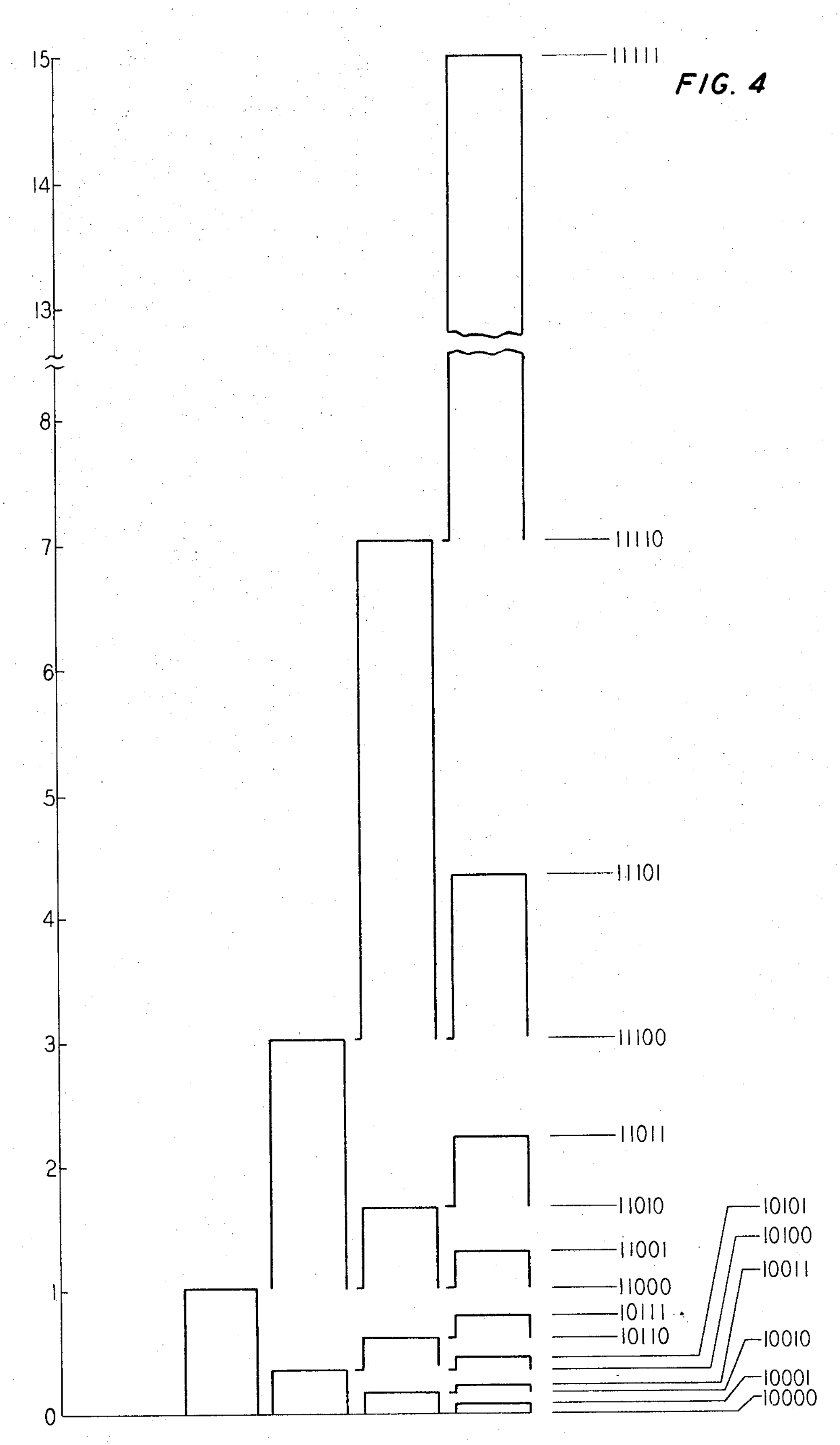
FIG. 4 is a diagram of the quantizing function of the arrangement of FIGS. 2 and 3.

FIG. 4 depicts a tree diagram for this encoding procedure. This diagram is useful for demonstrating the effect of companding. In FIG. 4, the ordinate represents the size of the signal sample to be coded, while the abscissa represents the sequence of the last four steps of a five digit coding process (the first digit represents the polarity of the sample). For example, samples between 4.3 and 7 are coded as 11,101 and samples between 0.78 and 1.0 are coded as 11,000. Thus, the quantizing noise figure for signals in the 4.3 to 7 range may be as large as 2.7, while the quantizing noise figure for noise signals between 0.78 and 1.0 can only be as great as 0.22. In this manner, on the average, the signal to quantizing noise ratio is kept reasonably uniform over all quantizing levels. Note that the diagram of FIG. 4 relates only to positive going signals. Such a diagram for negative going signals will be exactly the same in appearance but with the ordinate inverted in polarity. It is also apparent that a complementary code may be obtained by simply reversing the designation of comparator pulses.

It is appropriate to note that all of the switches that have thus far been mentioned may be embodied as field effect transistors, fast acting diodes, bipolar transistors, or any other of a variety of switching devices which would be suitable. It is significant that, since capacitors are used as the elements in the feedback and input paths of the operational amplifier, no DC current flows in the circuits. Thus, the impedance of switches 37, 38, 39 and 41 may be ignored. Furthermore, the nature of the operational amplifier circuitry makes this configuration particularly suitable for nonlinear operation because the reference voltages need not be large. Moreover, the configuration is therefore a superior one in its power consumption aspect.

The arrangement of FIG. 2 and the relative weighting of the capacitors as shown in FIG. 3, with the resultant compression characteristics of FIG. 4, is intended as an example of the principles of the present invention. It is possible to obtain a wide range of compression parameters by changing the values of the various components. For example, if capacitor 36 is chosen as 5C instead of C, the maximum gain ratio will be reduced from 15 to 3. Likewise, if the capacitance values of capacitors 31 through 34 are doubled, the maximum gain will be increased from 15 to 30.

Figure 5:
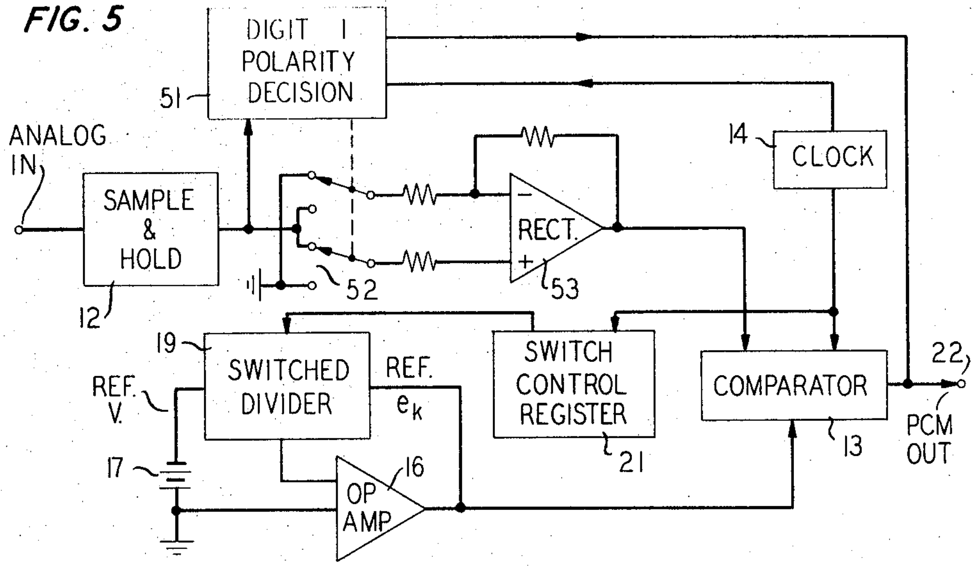
FIG. 5 is a block diagram of a second illustrative embodiment of the invention.

In FIG. 5, there is shown an alternative embodiment of an encoding arrangement according to the principles of the invention. To account for signals of both polarities, this embodiment relies on full wave rectification instead of the polarity switching which is utilized in the embodiment of FIG. 2. Components in FIG. 5 which correspond to identical components in FIG. 2 are noted with the same numbers. In FIG. 5, the switched divider 19, the operation amplifier 16, the switch control register 21 (with the exception of "digit 1" aspect), the comparator 13, and the sample and hold circuit 12 all operate similarly to those of FIG. 2. In this embodiment, however, the reference voltage 17 becomes a unipolar voltage source. Analog signal samples of both positive and negative polarities are accounted for by the operation of the digit "1" polarity decision 51. Thus, each time a new portion of the analog signal is taken by the sample and hold circuit 12, a decision is made by the digit one decision block 51 regarding its polarity. If the particular analog sample is negative in polarity, a pulse representing a " 1" is sent to the PCM output 22 and the double pole double throw switch 52 is connected as shown in FIG. 5. On the other hand, if the analog sample is positive, a "0" is sent to the PCM output 22 and switch 52 is closed in the manner opposite to that shown in FIG. 5. As may be recalled from the previous discussion, the position of switch 52 designated in FIG. 5 connects rectifying amplifier 53 in an inverting configuration, while the other position for switch 52 connects the rectifying amplifier 53 in a noninverting configuration. In this way, switch 52 and rectifying amplifier 53 together perform a full wave rectification, and the comparator 13 always receives a positive version of the analog sample. Thereafter, the encoding procedure of the respective analog samples proceeds similarly to the operation of the embodiment of FIG. 2.

Figure 6:
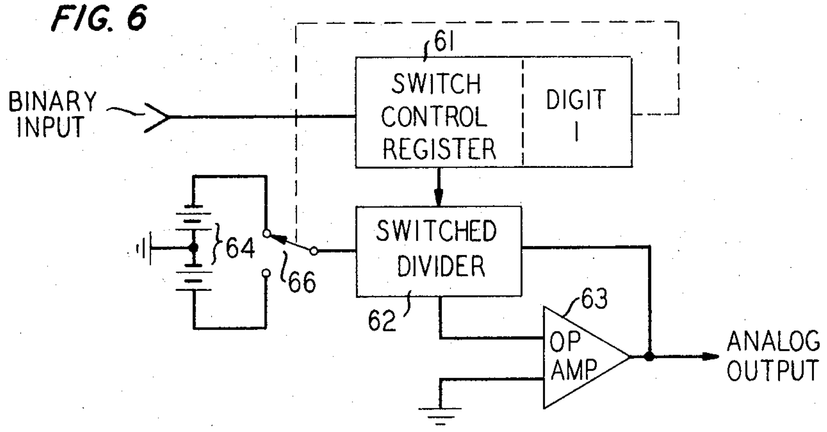
FIG. 6 is a block diagram of a decoder using the principles of the invention.
Figure 7:
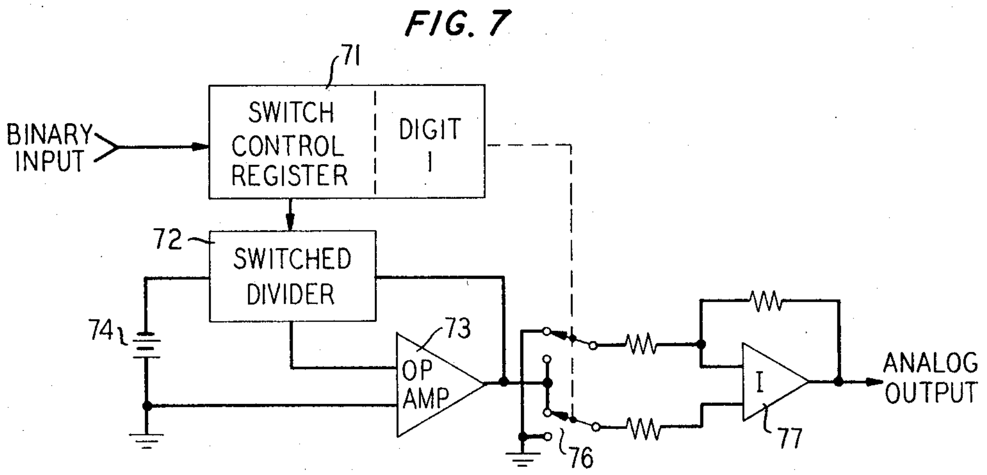
FIG. 7 is a block diagram of another decoder embodying the principles of the invention.

The discussion has thus been restricted to self compressing coders to be used at the transmission end of a transmission system. The principles of the invention are equally applicable to self expanding decoders to be used at the receiving end of a transmission system. In FIGS. 6 and 7, two self expanding decoders which embody the principles of the invention are shown.

The decoder depicted in FIG. 6 utilizes the principle of polarity switching to account for analog samples of both positive and negative polarities. Thus, when a binary word representing a coded analog sample is received at the binary input, it is placed in switch control register 61. There the first digit is used by the "digit 1" aspect of the switch control register 61 to control the single pole double throw switch 66 and thereby obtain a reference voltage of the proper polarity from reference voltage source 64. The remainder of the binary digits in the binary input word, by means of the operation of switch control register 61, activate the switches in switched divider 62 to obtain the proper configuration of the circuitry therein to represent the particular analog sample which is to be decoded. This determines the desired feedback and input circuitry for operational amplifier 63 and, therefore, the analog output voltage.

FIG. 7 shows an alternative self expanding decoder which embodies the principles of the invention. The decoder of FIG. 7, however, utilizes amplifier inversion to allow for the decoding of analog samples of both polarities. Thus, when a binary input word is received by switch control register 71, the first digit is used to control the position of the double pole double throw switch 76 in the same manner as the digit one polarity decision was made for switch 52 in the encoder of FIG. 5. The setting of switch 76 connects amplifier 77 in either an inverting or noninverting configuration. In this manner, analog outputs of both polarities are obtained. Then, switched divider 72, operational amplifier 73 and voltage source 74 operate in conjunction with the switch control register 71 upon the remaining digits of the binary word to obtain the decoded analog output in a manner identical to that of the decoder of FIG. 6.

The foregoing embodiments of the invention have been intended to illustrate the principles thereof. Numerous other embodiments of these principles may occur to workers skilled in the art without departure from the spirit and scope of the invention.

What is claimed is:

1. In a system that utilizes both analog type and digital type signals at different points therein, means for converting a signal of one type to a corresponding signal of the other type comprising an operational amplifier having input and feedback circuits, means for applying a reference voltage from a source to the input circuit of said amplifier, means for varying the gain ratio of said amplifier in accordance with a nonlinear quantizing function, said gain ratio varying means comprising a plurality of capacitors weighted in accordance with the quantizing function and means, responsive to the signals to be converted, for switching select ones of said capacitors between said input and said feedback circuits, whereby each unique configuration of said input and said feedback circuits results in an amplifier gain ratio producing an amplifier output voltage corresponding to a unique quantum level.

2. A converting means as claimed in claim 1, wherein said plurality of capacitors comprises a unit capacitor and a plurality of weighted capacitors, said unit capacitor being fixed in the feedback path of said amplifier and each of said switched capacitors being connected by said switching means and between said output terminal and said reference voltage source.

3. A converting means as claimed in claim 2, wherein said nonlinear quantizing function is a hyperbolic function, said unit capacitor being valued at some unit value and said switched capacitors being valued at some integral multiple of the unit value to correspond to the hyperbolic quantizing function.

4. A converting means as claimed in claim 1, wherein said means for applying a reference voltage comprises a voltage source capable of producing a reference voltage of either polarity, and means, responsive to the signal to be converted, for selecting the polarity of said reference voltage source.

5. An analog to digital converter comprising a source of samples of the analog voltage to be converted, an operational amplifier having input and feedback circuits, means for applying a reference voltage from a source to the input circuit of said amplifier, a source of timing pulses, means, under control of the timing pulses, for comparing the output voltage of said amplifier with the analog samples and for producing digital signals representative of these comparisons, means for varying the gain ratio of said amplifier in accordance with a nonlinear quantizing function, said gain ratio varying means comprising a plurality of capacitors weighted in accordance with the quantizing function, and means, responsive to said comparisons, for switching select ones of said capacitors between said input and said feedback circuits, whereby each unique configuration of said input and said feedback circuits results in an amplifier gain ratio producing an amplifier output voltage corresponding to a unique quantum level.

6. A converting means as claimed in claim 5, wherein said plurality of capacitors comprise a unit capacitor and a plurality of weighted capacitors, said unit capacitor being connected in the feedback circuit of said amplifier and each of said weighted capacitors being connected by said switching means between said output terminal and said reference voltage source.

7. A converting means as claimed in claim 5, wherein said means for applying a reference voltage comprise a voltage source capable of producing a reference voltage of either polarity, and means, responsive to the signal to be converted, for determining the polarity of said reference voltage source.

* * * * *